(12) United States Patent
Asada et al.

(10) Patent No.: US 6,838,716 B2
(45) Date of Patent: Jan. 4, 2005

(54) CMOS IMAGE SENSOR AND MANUFACTURING METHOD OF THE SAME

(75) Inventors: Hitoshi Asada, Kawasaki (JP); Kiyoshi Miyazawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/753,616

(22) Filed: Jan. 4, 2001

(65) Prior Publication Data

US 2001/0030332 A1 Oct. 18, 2001

(30) Foreign Application Priority Data

Apr. 14, 2000 (JP) .......................... 2000-113473

(51) Int. Cl.$^7$ .......................... H01L 31/062; H01L 31/06
(52) U.S. Cl. .......................... 257/292; 257/291; 257/462; 257/377
(58) Field of Search .......................... 257/291, 292, 257/369, 431, 377, 462; 438/48, 309, 377

(56) References Cited

U.S. PATENT DOCUMENTS

| | | | |
|---|---|---|---|
| 5,264,721 A | * | 11/1993 | Gotou .......................... 257/349 |
| 6,023,081 A | * | 2/2000 | Drowley et al. .......................... 257/290 |
| 6,040,592 A | * | 3/2000 | McDaniel et al. .......................... 257/291 |
| 6,040,593 A | * | 3/2000 | Park .......................... 257/233 |
| 6,174,810 B1 | * | 1/2001 | Islam et al. .......................... 438/622 |
| 6,184,055 B1 | * | 2/2001 | Yang et al. .......................... 257/233 |
| 6,351,003 B1 | * | 2/2002 | Kuriyama .......................... 257/229 |

FOREIGN PATENT DOCUMENTS

JP    10-248035    9/1998

* cited by examiner

Primary Examiner—Eddie Lee
Assistant Examiner—Samuel A Gebremariam
(74) Attorney, Agent, or Firm—Westerman, Hattori, Daniels & Adrian, LLP

(57) ABSTRACT

Without forming a silicide film on a surface of a photodiode PD formation portion and a surface of a drain portion of a reset transistor T1 having an impurity region as a drain connected to an impurity region of the photodiode PD, the silicide film is formed on a surface of a source portion of the reset transistor T1 and a surface of a source/drain portion of other MOS transistors.

7 Claims, 20 Drawing Sheets

CMOS IMAGE SENSOR AND MANUFACTURING METHOD OF THE SAME

BACKGROUND OF THE INVENTION

1. Field of the Invention

The present invention relates to a CMOS image sensor composed of a photodiode and a MOS transistor, which are formed on a semiconductor substrate and a manufacturing method of the same.

2. Description of the Prior Art

Recently, a CMOS image sensor has been widely used as a solid state imaging device. The CMOS image sensor has various kinds of advantages that it consumes less power compared to CCDs (Charge Coupled Device), can be driven by a single power source, and can fabricate peripheral circuits such as a timing generating circuit, a reading-out circuit and an A/D converter unitedly.

FIG. 1 is an equivalent circuit diagram for one pixel of the CMOS image sensor. One pixel of the CMOS image sensor shown in FIG. 1 is composed of one photodiode PD, three N-channel MOS transistors T1, T2, and T3. The cathode of the photodiode PD is connected to the drain of the transistor T1 and the gate of the transistor T2. The sources of the transistors T1 and T2 are connected to a power supply line to which a reference voltage VR is supplied. Moreover, the gate of the transistor T1 is connected to a reset line to which a reset signal RST is supplied.

The source of the transistor T3 is connected to the drain of the transistor T2, and the drain of the transistor T3 is connected to a reading-out circuit (not shown) through a signal line. The gate of the transistor T3 is connected to a column selection line to which a select signal SLCT is supplied.

The transistor T1 is called a reset transistor, and the transistor T2 is called a drive transistor. Moreover, the transistor T3 is called a selection transistor.

In the CMOS image sensor, a plurality of pixels which are illustrated by the equivalent circuit in FIG. 1 are arranged in horizontal and vertical directions in a semiconductor substrate, and peripheral circuits such as a reading-out circuit and an A/D (analog digital) conversion circuit are formed outside a region where the plurality of pixels are formed.

Note that in Japanese Patent Laid-Open No. 10(1988)-248035, disclosed is a driving method in which a potential of a signal supplied to a gate of a reset transistor is allowed to change in three stages, and a dynamic range of a CMOS image sensor is widened.

By the way, when the circuit shown in FIG. 1 is formed on a semiconductor substrate, it is necessary to connect electrically a source/drain of a MOS transistor formed on the semiconductor substrate and a wiring formed on the semiconductor substrate with an insulating film therebetween. When a contact hole is formed in the insulating film and a conductive substance is buried in the contact hole, simply, a contact resistance between the conductive substance and the source/drain is large. Although it is conceived to make the resistivity low by forming a silicide film on a surface of the source/drain of the MOS transistor and connecting electrically the source/drain and the wiring with the silicide film therebetween, leak current increases at a connection portion of the reset transistor and the photodiode with such structure, thus causing deterioration in characteristics. Note that the leak current includes a periphery length component which leaks at an edge portion of a field oxide film and an area component which leaks at a PN junction portion. The cause of the leak at the periphery length component is considered as follows. Injection ions are absorbed in the silicide at a portion where a concentration of the injection ions of the edge of the field oxide film is presumed to be low, and hence the ion concentration becomes lower. Moreover, the area component is considered to be increased because a depletion layer is contaminated with metal atoms in forming the silicide.

SUMMARY OF THE INVENTION

The object of the present invention is to provide a CMOS image sensor which suppresses leak current at a drain portion of a reset transistor by reducing a resistivity between source/drain of a MOS transistor and a wiring, and a manufacturing method of the same.

The CMOS image sensor of the present invention composed of a photodiode having an impurity region formed in a semiconductor substrate, and a first and a second MOS transistors formed by introducing impurities into the semiconductor substrate, wherein no silicide film exists on surface of impurity regions of the first MOS transistor disposed at least on a side of the photodiode, the impurity region being connected to an impurity region of the photodiode, and the suicide film is provided on surfaces of impurity regions of the second MOS transistor.

In the present invention, the silicide film is not formed on the impurity region (source or drain) of the first MOS transistor (reset transistor) which is connected to the photodiode and disposed on the side of the photodiode. Therefore, an increase in a leak current owing to metal atoms is prevented, and the CMOS image sensor showing less noise can be obtained.

Furthermore, in the present invention, the silicide film is formed on the impurity region of the second MOS transistor. Then, the wiring and the impurity region are electrically connected so as to interpose the silicide film therebetween. Thus, a contact resistance between the wire and the impurity region becomes low, and deterioration of electrical characteristics can be avoided.

The manufacturing method of the CMOS image sensor of the present invention comprises the steps of: forming a photodiode by introducing impurities into a semiconductor substrate; forming a gate electrode on the semiconductor substrate so as to interpose a gate insulating film therebetween; forming a plurality of N channel MOS transistors by introducing N type impurities into the semiconductor substrate, the N channel MOS transistors including a reset transistor having an N type impurity region connected to a cathode of the photodiode; forming a first insulating film covering a region extending at least from the photodiode to an impurity region on one side of the reset transistor positioned on one side of the photodiode; and forming a metal film above the semiconductor substrate and allowing metal in the metal film and silicon on a surface of the silicon substrate to react with each other, thus forming a silicide film.

BRIEF DESCRIPTION OF THE DRAWINGS

FIGS. 19A to 19C are diagrams showing the manufacturing method of the CMOS image sensor of the embodiment, and section views (No. 8) of a peripheral CMOS circuit formation portion.

DESCRIPTION OF THE PREFERRED EMBODIMENTS

Embodiments of the present invention will be described with reference to the accompanying drawings below.

Figure 2:
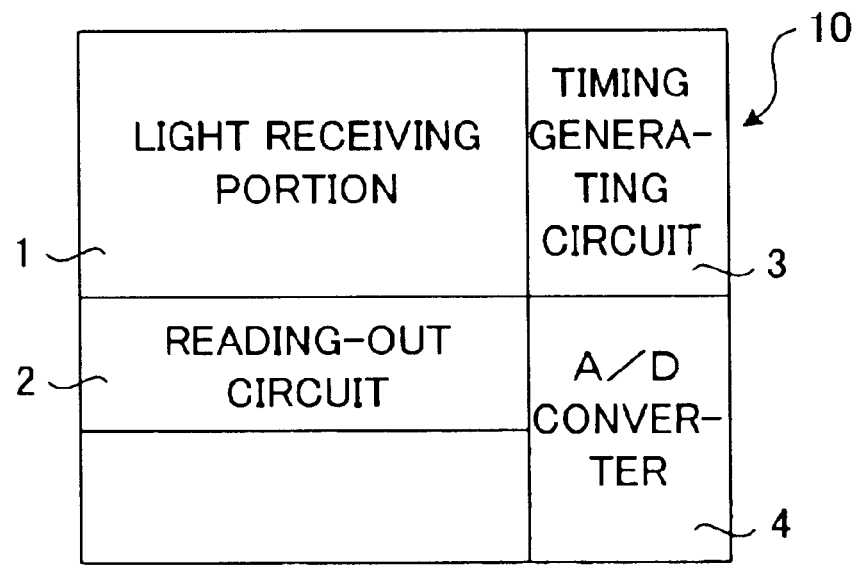
FIG. 2 is a block diagram of a CMOS image sensor of an embodiment according to the present invention.
Figure 3:
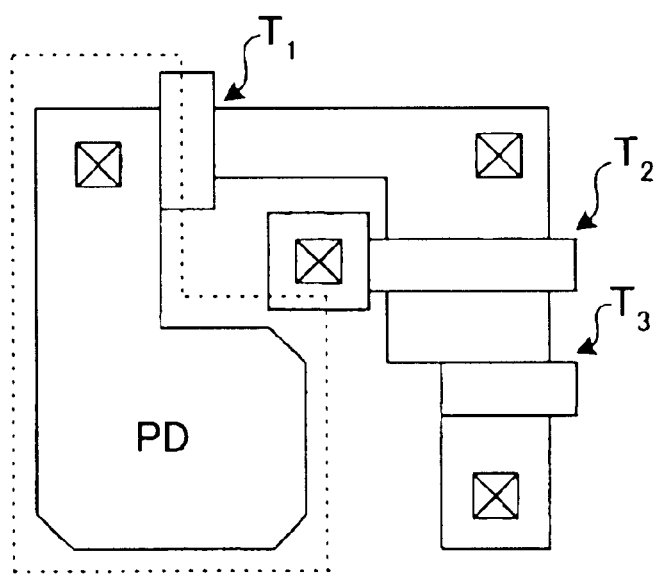
FIG. 3 is a plan view showing one pixel of the CMOS image sensor thereof.

FIG. 2 is a block diagram of a CMOS image sensor of an embodiment of the present invention, and FIG. 3 is a plan view showing one pixel of the CMOS image sensor thereof.

Figure 1:
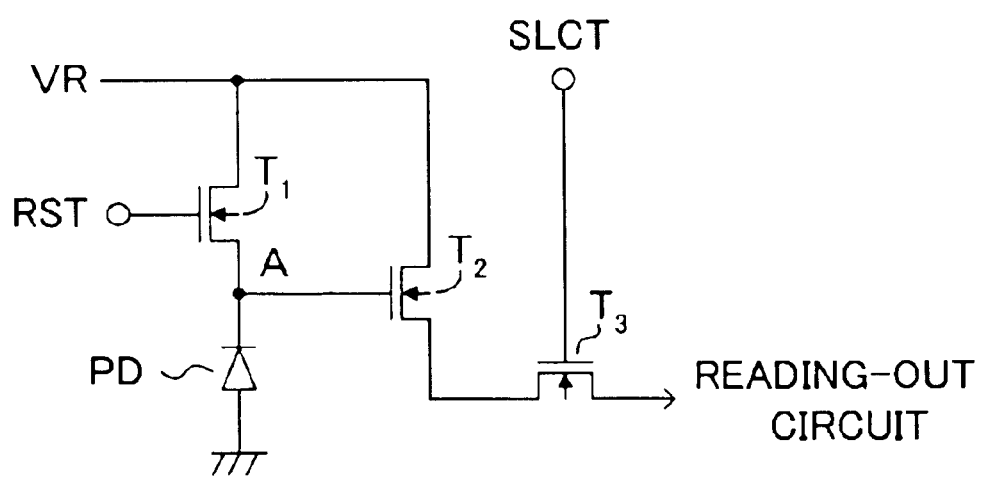
FIG. 1 is an equivalent circuit diagram of one pixel of a CMOS image sensor.

As shown in FIG. 2, a light receiving portion 1, a reading-out circuit 2, a timing generating circuit 3, an A/D converter 4 and the like are formed on a silicon semiconductor substrate 10. A plurality of pixels are formed in the light receiving portion 1 so as to be arranged. One pixel is composed of one photodiode PD and three N channel MOS transistors T1, T2, and T3 as shown in FIG. 3, and an equivalent circuit thereof is illustrated by FIG. 1. Moreover, the circuits such as the reading-out circuit 2, the timing generating circuit 3 and the A/D converter 4 are constituted of CMOS transistors.

FIGS. 4 to 19 are drawings showing a manufacturing method of the CMOS image sensor of the embodiment of the present invention. Note that FIGS. 4 to 11 are section views of portions of the photodiode and the reset transistor T1, and FIGS. 12 to 19 are section views in a CMOS circuit portion of a peripheral circuit.

Figure 4A:
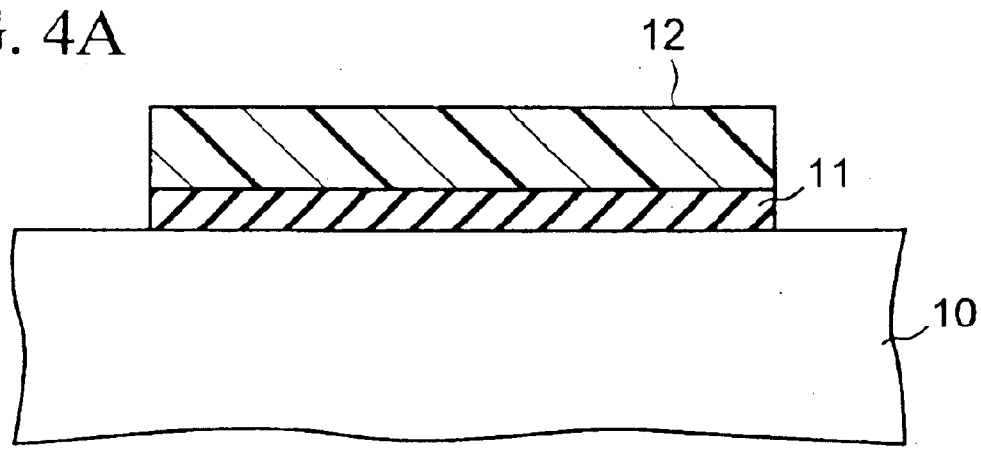
FIGS. 4A to 4C are diagrams showing a manufacturing method of a CMOS image sensor of an embodiment, and section views (No. 1) of formation portions of a photodiode and a reset transistor.
Figure 12A:
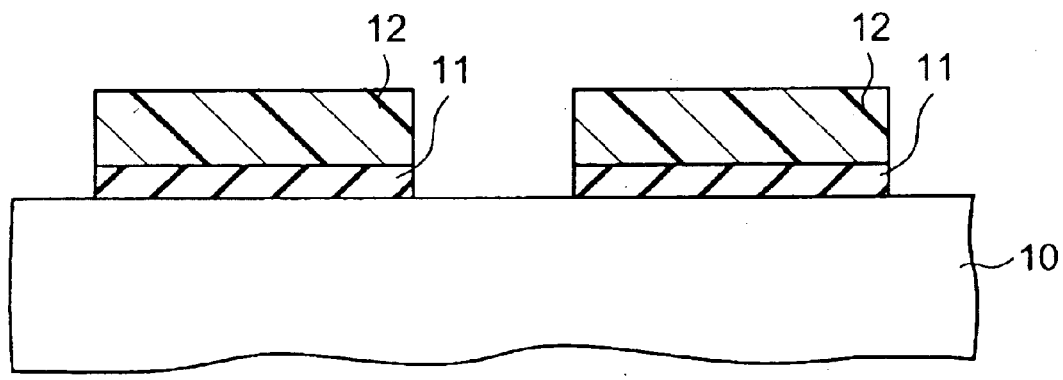
FIGS. 12A to 12C are diagrams showing the manufacturing method of the CMOS image sensor of the embodiment, and section views (No. 1) of a peripheral CMOS circuit formation portion.

First, as shown in FIG. 4A and FIG. 12A, a surface of the silicon semiconductor substrate 10 is thermally oxidized and a silicon oxide film (not shown) having a thickness of about 3 nm is formed, and thereafter a silicon nitride film (SiN film) 11 is formed to a thickness of about 115 nm thereon. Then, a resist film 12 having an opening portion at a portion corresponding to a field oxide film formation portion is formed on the silicon nitride 11, and the silicon nitride film 11 is etched using the resist film 12 as a mask. Thereafter, the resist film 12 is removed.

Figure 4B:
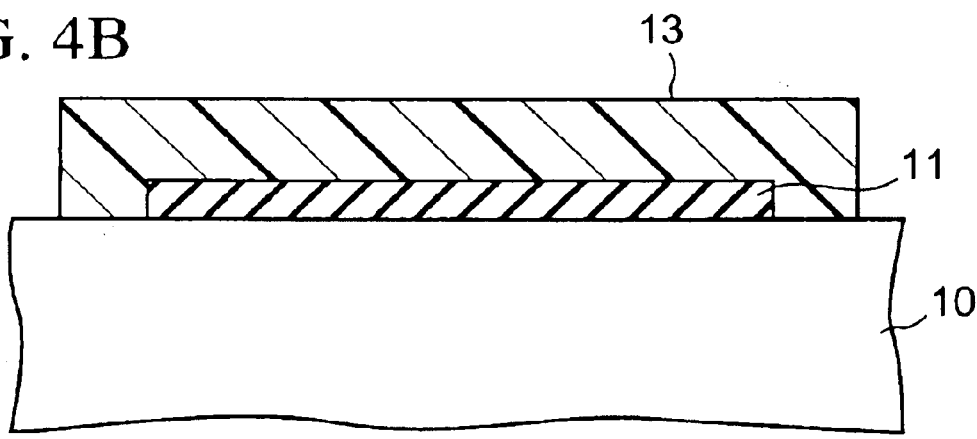
Figure 12B:
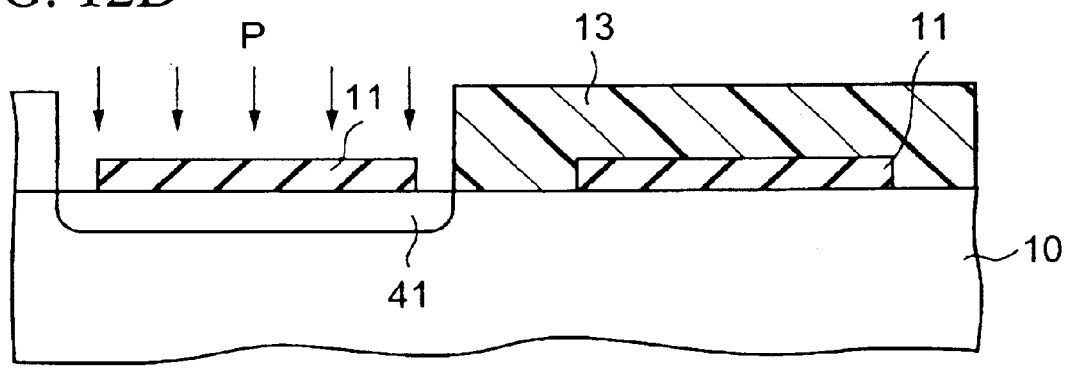

Next, as shown in FIG. 4B and FIG. 12B, the entire surface of the resultant structure is coated with a photoresist film 13 so as to cover the silicon nitride film 11, and an opening portion is provided at a portion corresponding to a P channel MOS transistor formation portion after exposure and developing steps. Phosphorus (F) is ion-injected to the semiconductor substrate 10 through the opening portion under conditions of, for example, 180 keV and $1.4 \times 10^{13}/cm^2$, and an N type impurity region 41 is formed.

Figure 4C:
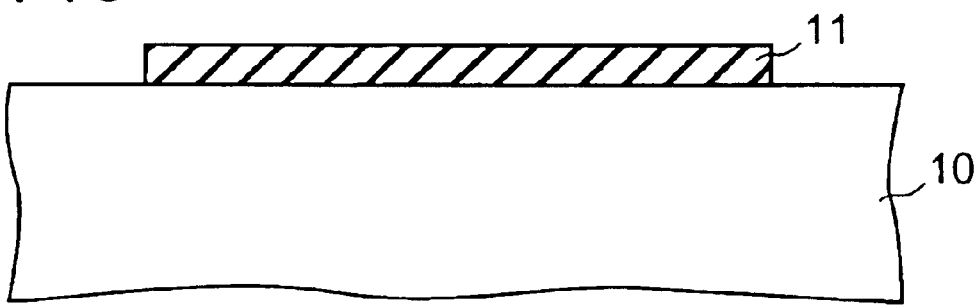
Figure 12C:
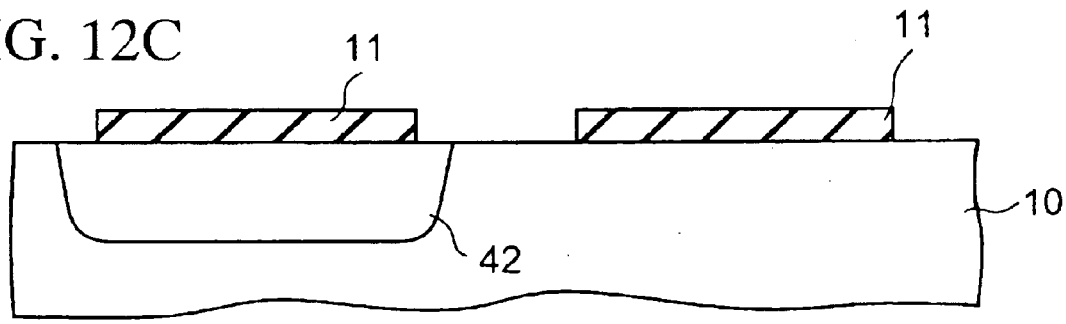

Thereafter, as shown in FIG. 4C and FIG. 12C, the resist film 13 is removed, and a thermal treatment is performed at a temperature of 1150° C. so as to diffuse the impurities. Thus, an N well 42 is formed in the P channel MOS transistor formation portion.

Figure 5A:
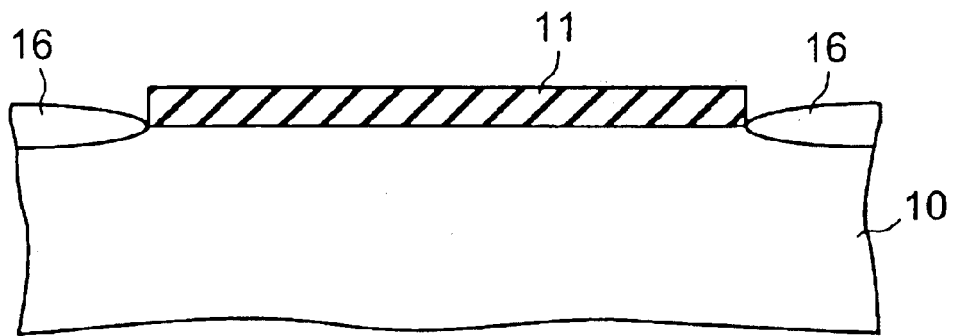
FIGS. 5A to 5C are diagrams showing the manufacturing method of the CMOS image sensor of the embodiment, and section views (No. 2) of formation portions of the photodiode and the reset transistor.
Figure 5B:
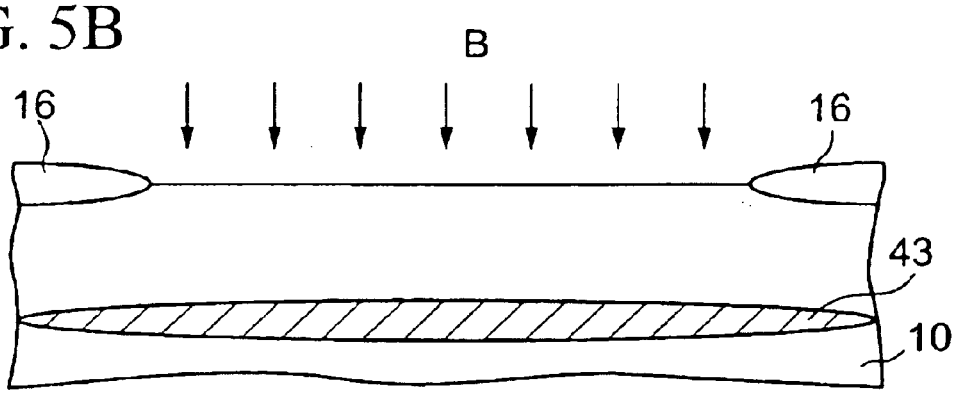
Figure 13A:
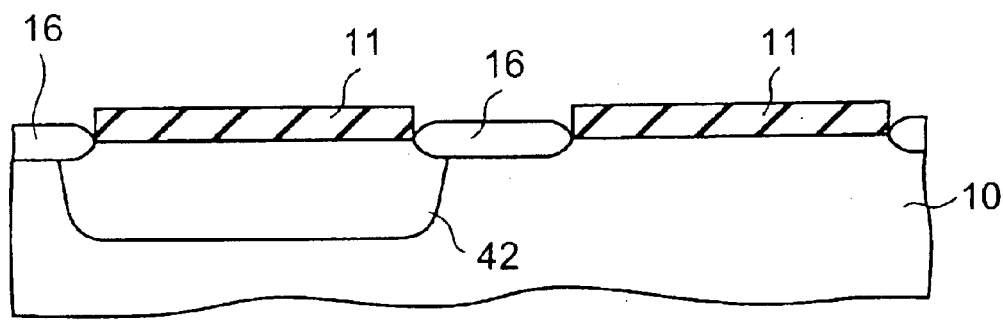
FIGS. 13A to 13C are diagrams showing the manufacturing method of the CMOS image sensor of the embodiment, and section views (No. 2) of a peripheral CMOS circuit formation portion.

Next, as shown in FIG. 5A and FIG. 13A, a thermal treatment is performed at a temperature of 900° C. and a field oxide film 16 having a thickness of about 370 nm is formed at a portion that is not covered with the silicon nitride film 11. Thereafter, the silicon nitride film 11 is removed.

Subsequently, a well of a photodiode formation portion is formed. Specifically, boron (B) is ion-injected to the whole of a light receiving portion under conditions of, for example, 600 keV and $3 \times 10^{12}/cm^2$, and a P type impurity layer (well) 43 is formed in the semiconductor substrate 10.

Figure 5C:
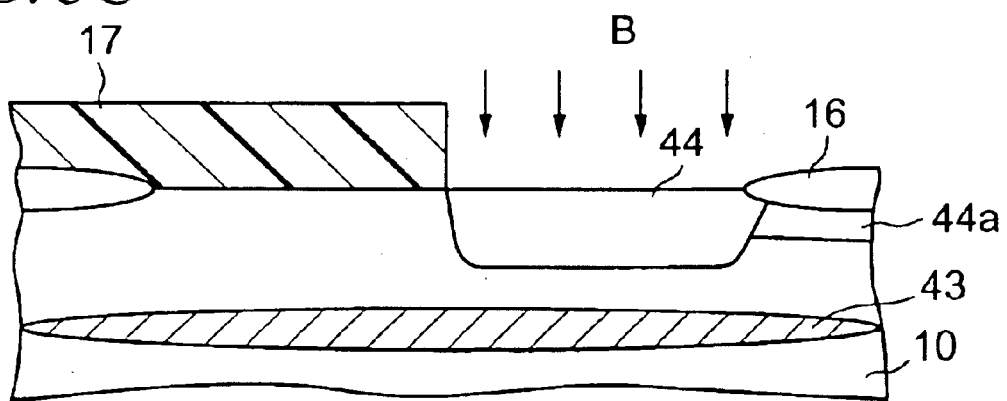
Figure 13B:
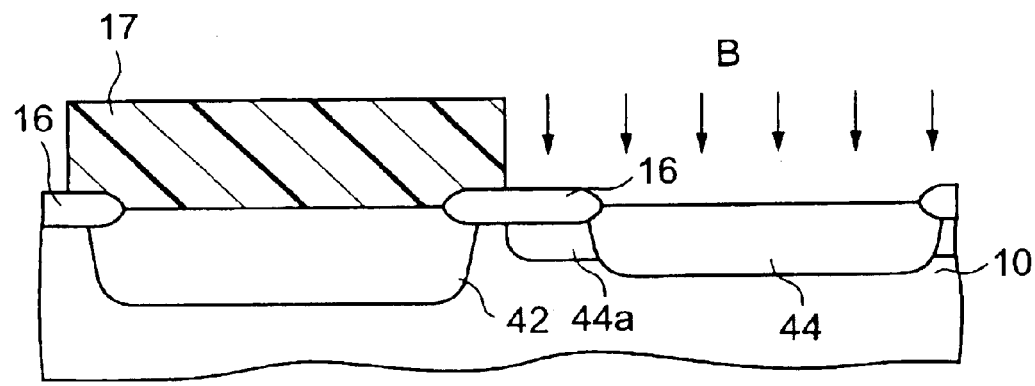

Thereafter, as shown in FIG. 5C and FIG. 13B, the photodiode formation portion and the P channel MOS transistor formation portion are covered with a resist film 17, and boron (B) is ion-injected to an N channel MOS transistor formation portion under conditions of, for example, 140 keV and $8 \times 10^{12}/cm^2$, and a P well 44 is formed. At the same time, a channel stopper layer 44a of an N channel MOS transistor. Thereafter, the resist film 17 is removed.

Figure 6A:
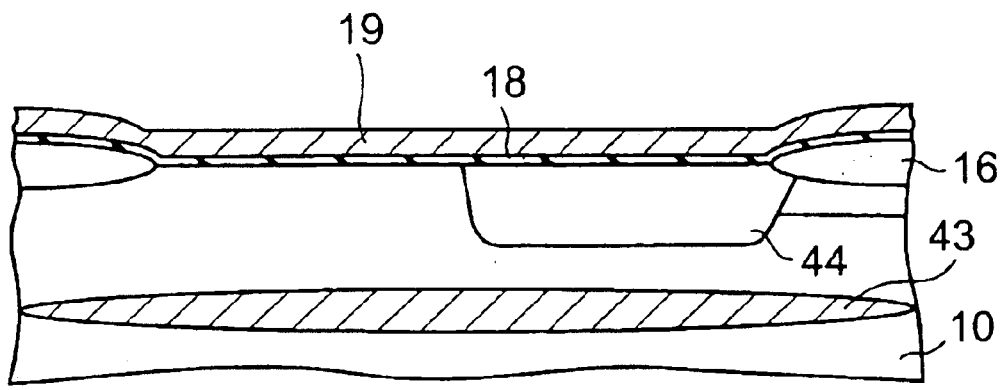
FIGS. 6A to 6C are diagrams showing the manufacturing method of the CMOS image sensor of the embodiment, and section views (No. 3) of formation portions of the photodiode and the reset transistor.
Figure 13C:
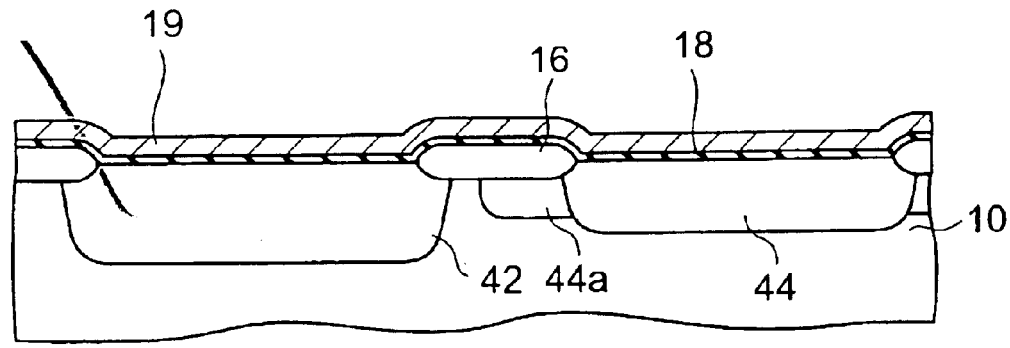

Next, as shown in FIG. 6A and FIG. 13C, a silicon oxide film (gate oxide film) 18 having a thickness of about b nmis formed on a surface of the semiconductor substrate 10 by performing a thermal treatment at temperature of 800° C. Then, an amorphous silicon film 19 is formed on the entire surface of the resultant structure to a thickness of about 50 nm by a CVD (Chemical Vapor Deposition) method.

Figure 6B:
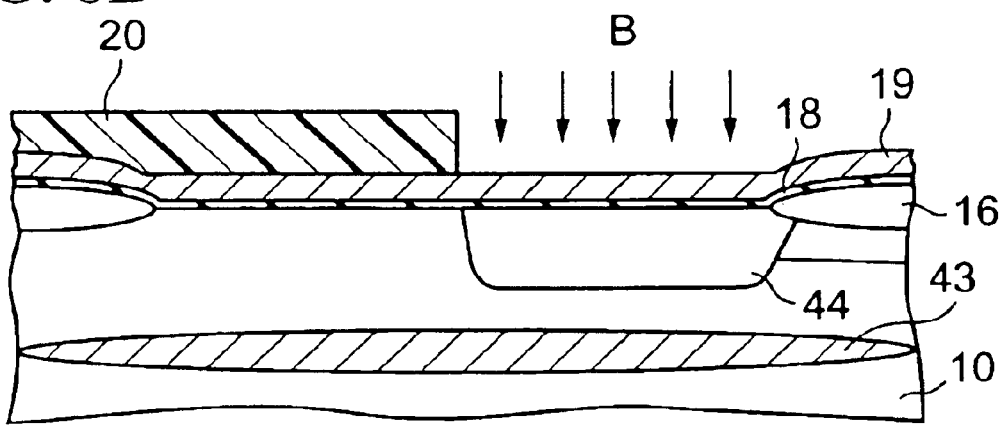

Thereafter, as shown in FIG. 6B, a resist film 20 is selectively formed on the amorphous silicon film 19 of the photodiode formation portion. Thereafter, boron (B) is ion-injected to a portion of the semiconductor substrate 10 that is not covered with the resist film 20 under conditions of, for example, 30 keV and $1.8 \times 1012/cm2$. This ion-injection is performed so as to adjust thresholds of the N and P channel MOS transistors. Thereafter, the resist film 20 is removed.

Figure 6C:
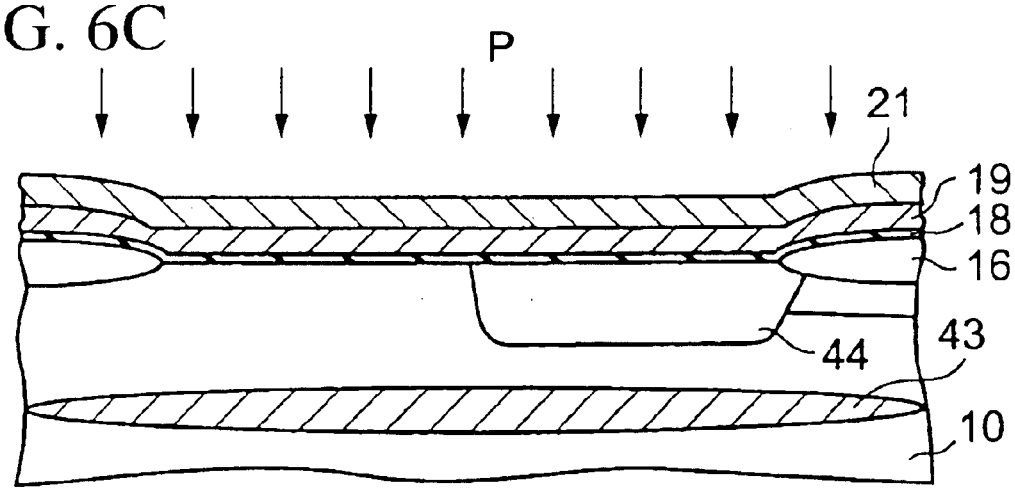
Figure 14A:
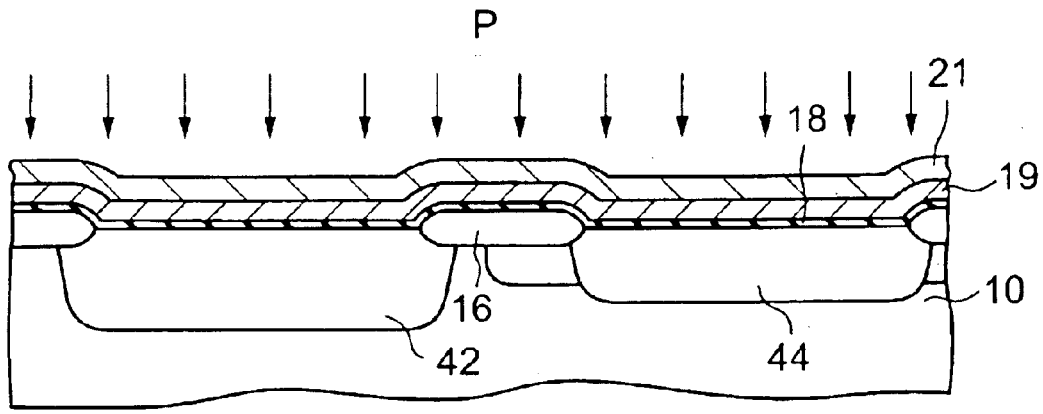
FIGS. 14A to 14C are diagrams showing the manufacturing method of the CMOS image sensor of the embodiment, and section views (No. 3) of a peripheral CMOS circuit formation portion.

Next, as shown in FIG. 6C and FIG. 14A, a WSi (tungsten silicon) film 21 is grown on the amorphous film 19 to a thickness of 150 nm. Then, the phosphorus (P) is ion-injected under conditions of, for example, 40 keV and $8 \times 10^{15/cm2}$, thus converting the amorphous silicon film 19 to a low resistance substance.

Figure 7A:
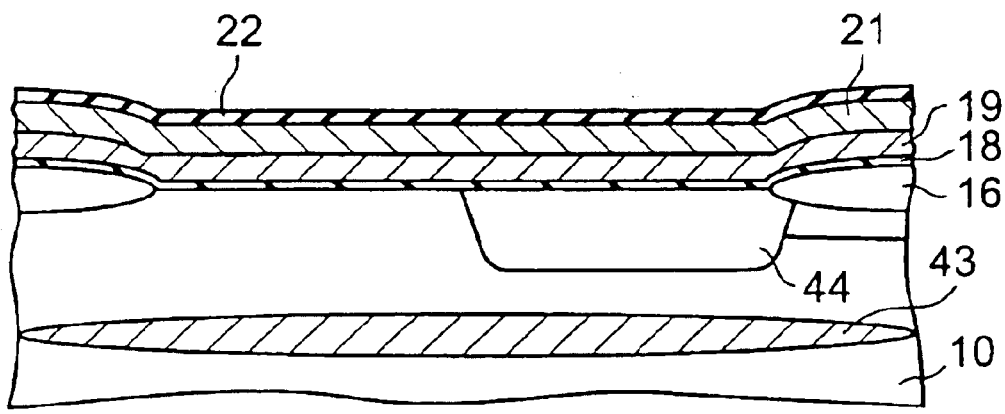
FIGS. 7A to 7C are diagrams showing the manufacturing method of the CMOS image sensor of the embodiment, and section views (No. 4) of formation portions of the photodiode and the reset transistor.
Figure 14B:
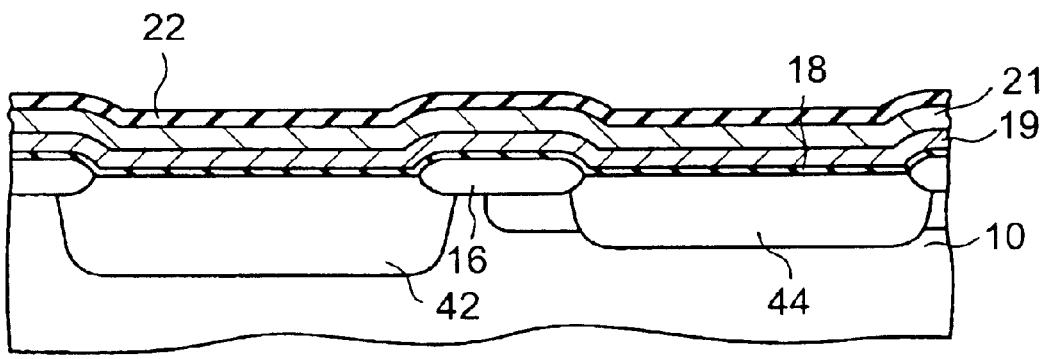

Subsequently, as shown in FIG. 7A and FIG. 14B, a silicon oxide film 22 is formed on the WSi film 21 to a thickness of about 45 nm by the CVD method. On the silicon oxide film 22, formed is an amorphous carbon film (not shown) as a reflection prevention layer to a thickness of about 32 nm by a PVD (Physical Vapor Deposition) method.

Figure 7B:
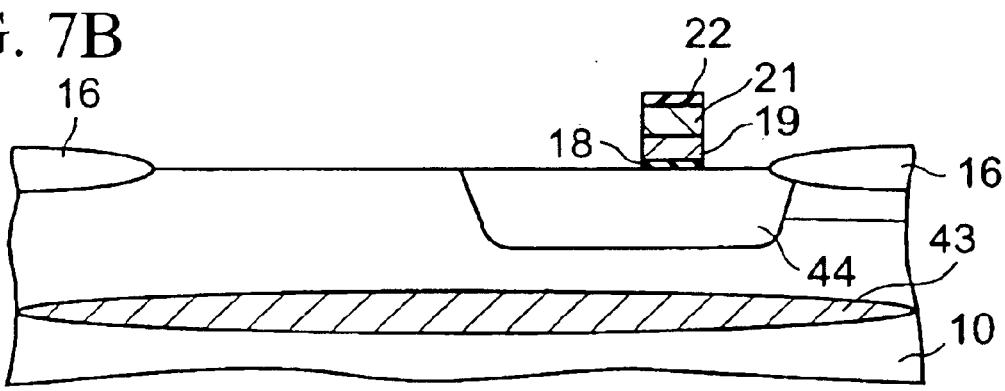
Figure 14C:
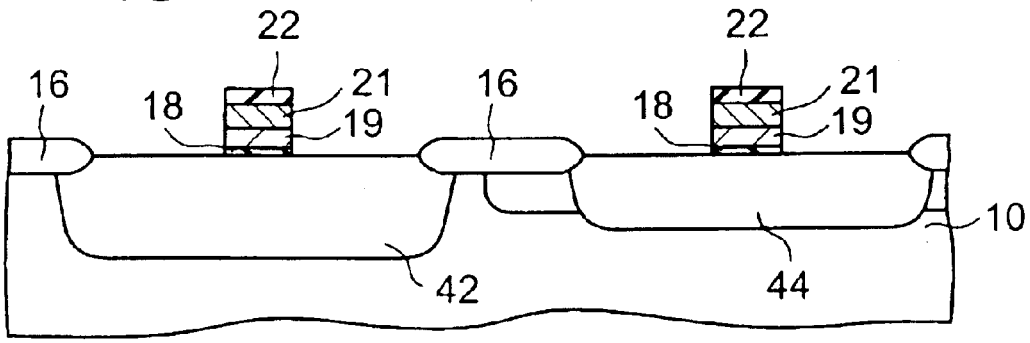

Thereafter, as shown in FIG. 7B and FIG. 14C, the amorphous carbon film, the silicon oxide film 22, the WSi film 21, the amorphous silicon film 19 and the silicon oxide film 18 are etched by photolithography, and gate electrodes of the MOS transistors are formed.

Figure 7C:
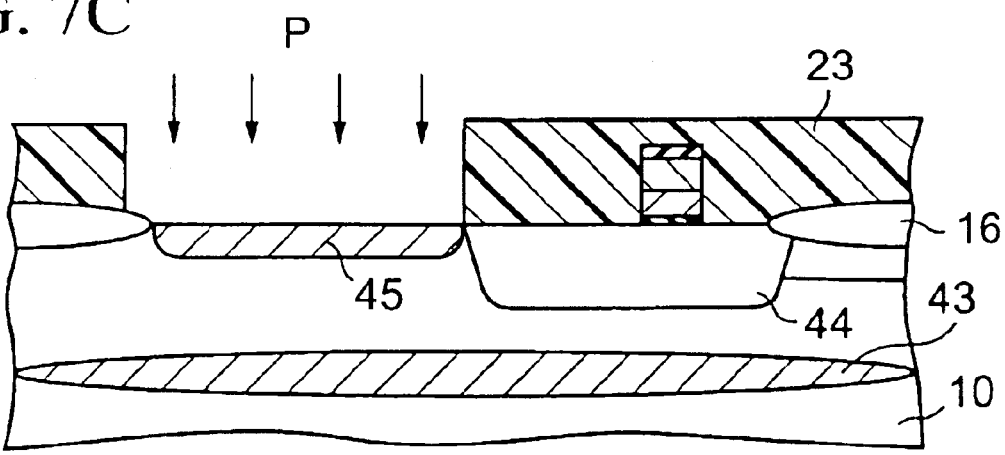

Next, as shown in FIG. 7C, a resist film 23 having an opening portion is formed in the photodiode formation portion, and then phosphorus (P) is ion-injected to the photodiode formation portion under conditions of, for example, 20 keV and $4 \times 10^{15/cm2}$, thus forming an N type impurity region 45. Thereafter, the resist film 23 is removed, and a thermal treatment is carried out at a temperature of 1000° C. and for 10 seconds.

Figure 8A:
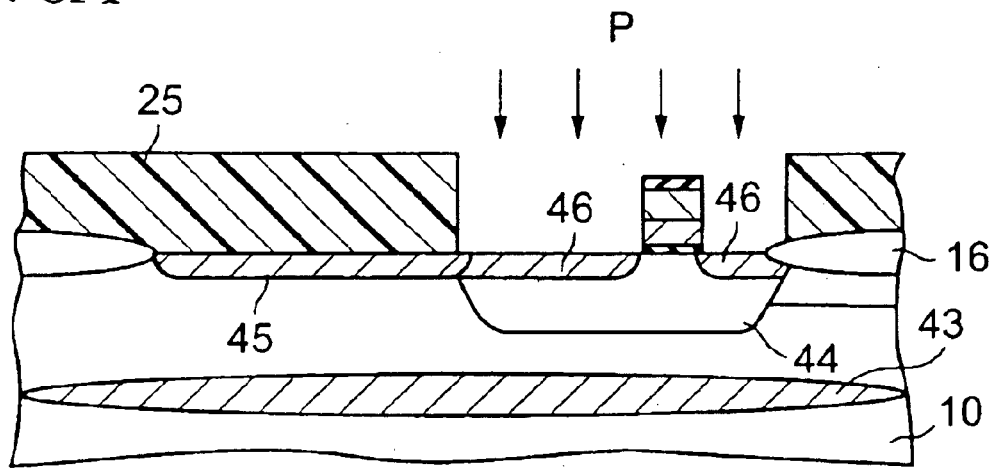
FIGS. 8A to 8C are diagrams showing the manufacturing method of the CMOS image sensor of the embodiment, and section views (No. 5) of formation portions of the photodiode and the reset transistor.
Figure 15A:
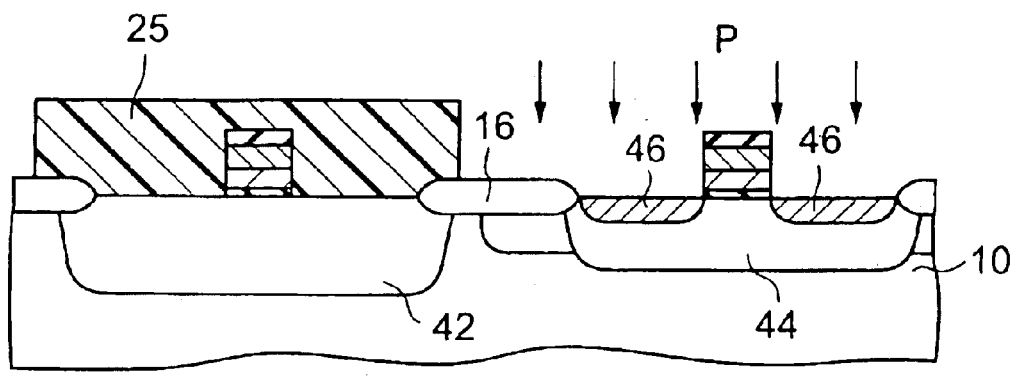
FIGS. 15A to 15C are diagrams showing the manufacturing method of the CMOS image sensor of the embodiment, and section views (No. 4) of a peripheral CMOS circuit formation portion.

Subsequently, as shown in FIG. 8A and FIG. 15A, a resist film 25 that covers the P channel MOS transistor formation portion and a photodiode formation portion is formed, and phosphorus (P) is ion-injected to both sides of the gate electrode of the N channel MOS transistor formation portion under conditions of, for example, 20 keV and $4 \times 10^3/cm^2$, thus, forming a low concentration N type impurity region 46. Thereafter, the resist film 25 is removed.

Figure 8B:
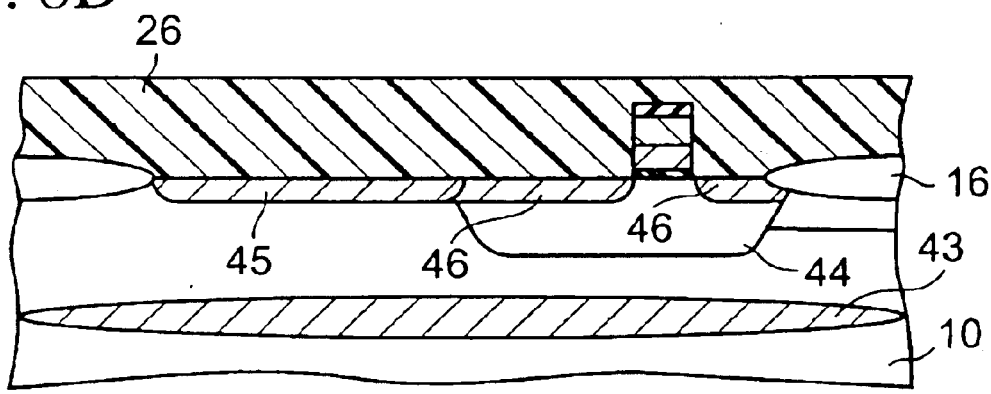
Figure 15B:
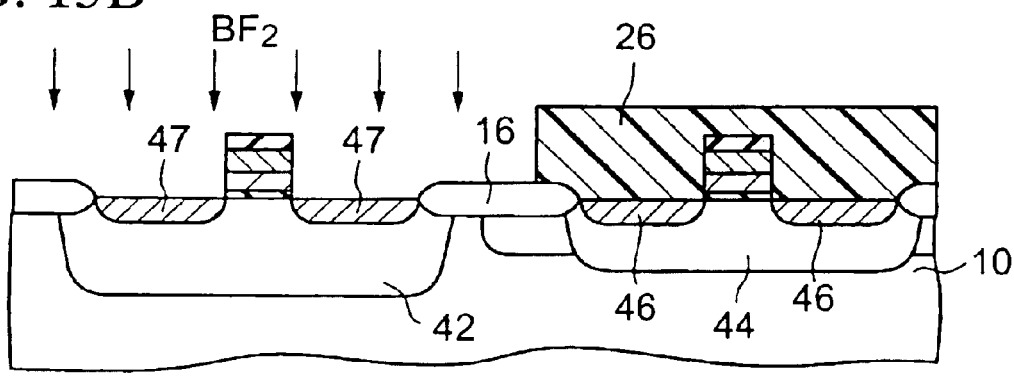

Next, as shown in FIG. 8B and FIG. 15B, a resist film 26 that covers the N channel MOS transistor formation portion and the photodiode formation portion is formed, and BF2 is ion-injected to both sides of the gate electrode of the P channel MOS transistor formation portion under conditions of, for example, 20 keV and $1013/cm2$, thus forming a low concentration P type impurity region 47. Thereafter, the resist film 26 is removed.

Figure 8C:
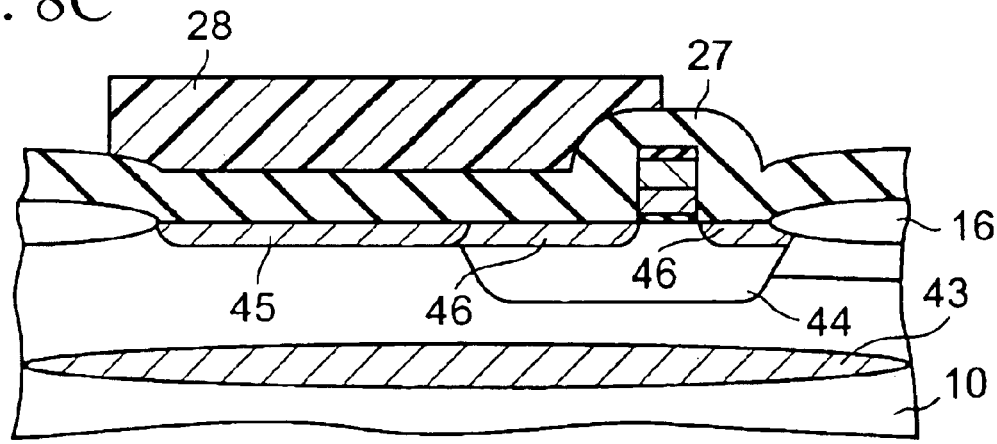
Figure 15C:
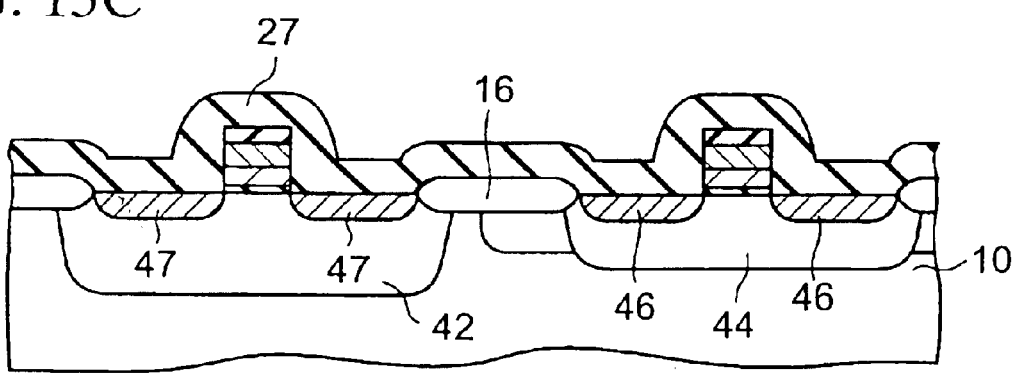

Subsequently, as shown in FIG. 8C and FIG. 15C, on the entire surface of the resultant structure, formed is a silicon oxide film 27 to a thickness of 120 nm. Then, a photoresist film 28 is formed on the silicon oxide film 27, and a portion serving as a silicide block is patterned. In this embodiment, the portion shown by the dotted lines in FIG. 3, that is, the portion extending from the photodiode formation portion to the drain of the reset transistor T1 is covered with the resist film 28.

Figure 9A:
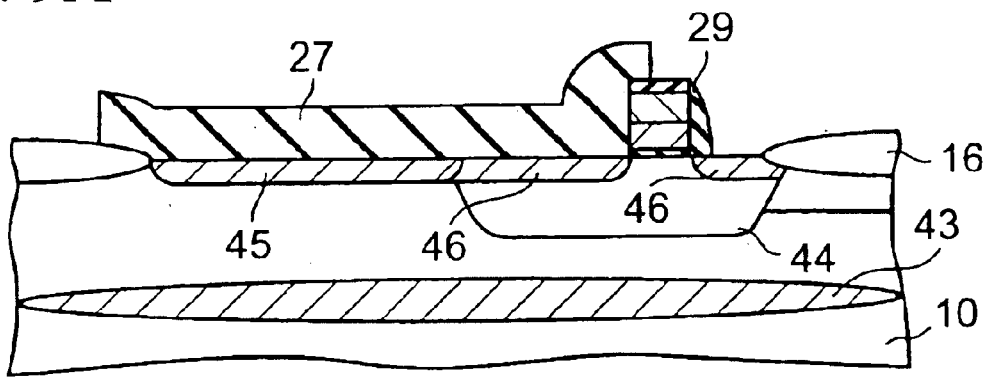
FIGS. 9A to 9C are diagrams showing the manufacturing method of the CMOS image sensor of the embodiment, and section views (No. 6) of formation portions of the photodiode and the reset transistor.
Figure 16A:
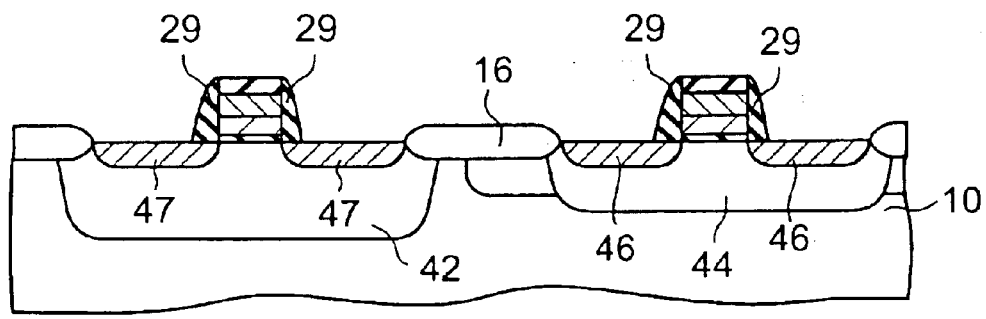
FIGS. 16A to 16C are diagrams showing the manufacturing method of the CMOS image sensor of the embodiment, and section views (No. 5) of a peripheral CMOS circuit formation portion.

Next, as shown in FIG. 9A and FIG. 16A, a side wall 29 is formed on the side portion of the gate electrode by performing anisotropic etching for the silicon oxide film 27. Thereafter, the resist film 28 is removed.

Figure 16B:
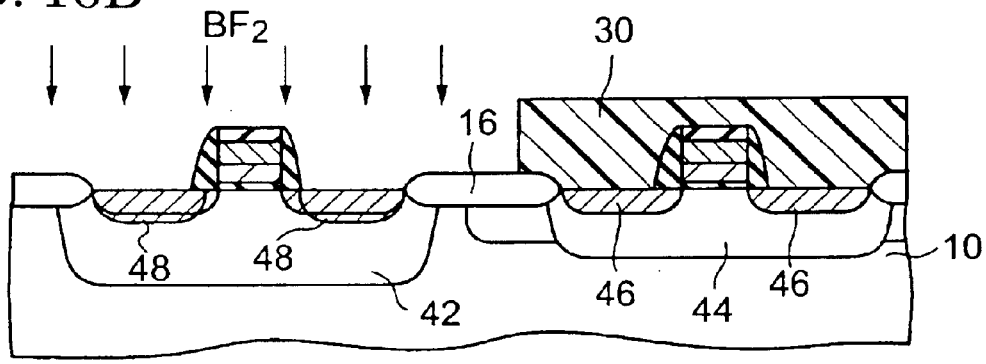

Subsequently, as shown in FIG. 16B, a resist film 30 that covers a portion other than P channel MOS transistor formation portion is formed, and BF2 is ion-injected to both sides of the gate electrode of the P channel MOS transistor under conditions of, for example, 20 keV and $3 \times 10^{15}/cm^2$, thus forming a high concentration P type impurity region 48. Thereafter, the resist film 30 is removed.

Figure 9B:
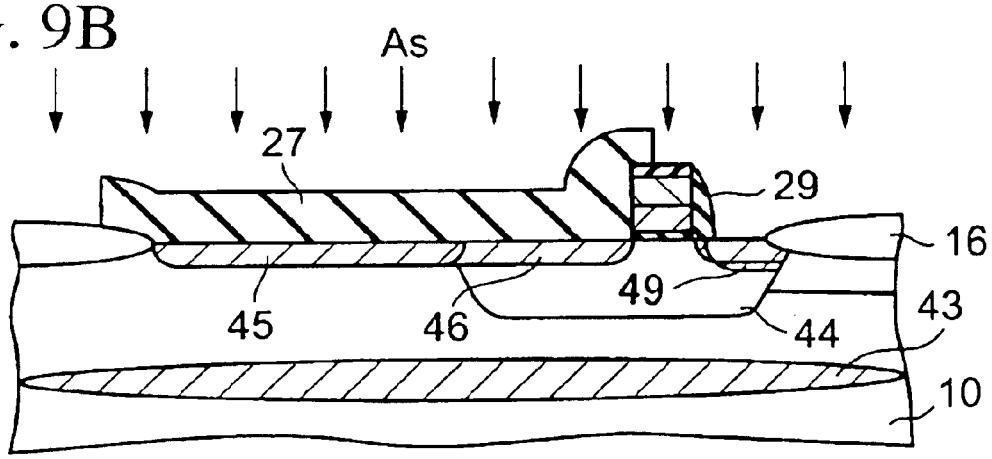
Figure 16C:
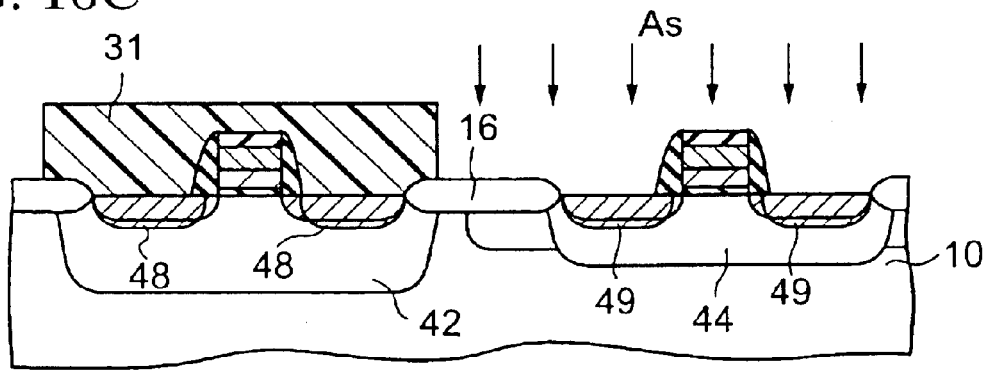

Furthermore, as shown in FIG. 9B and FIG. 16C, a resist film 31 that covers the P channel MOS transistor formation portion is formed, and arsenic (As) is ion-injected to both sides of the gate electrode of the N channel MOS transistor under conditions of, for example, 30 keV and $10^{15}/cm^2$, thus forming a high concentration P type impurity region 49. Thereafter, the resist film 31 is removed. Then, the P type channel impurity region 48 and the N type impurity region 49 are activated by performing a thermal treatment at 1000° C. and for 10 seconds. Thus, an N channel MOS transistor and a P channel MOS transistor having an LDD structure are completed. Note that though the drain side of the reset transistor T1 (a side connected to the photodiode) is not formed to the LDD structure, it was confirmed by experiments performed by the inventors of this application that any trouble is not brought about practically even if this side is formed to the LDD structure.

Figure 9C:
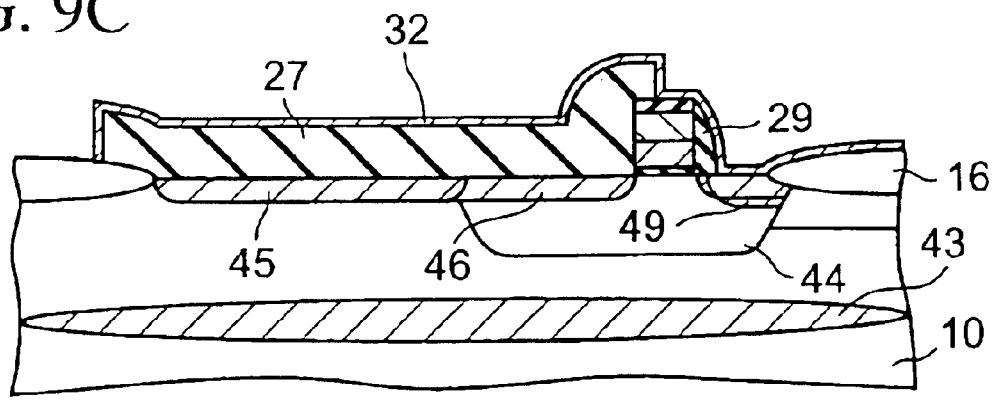
Figure 17A:
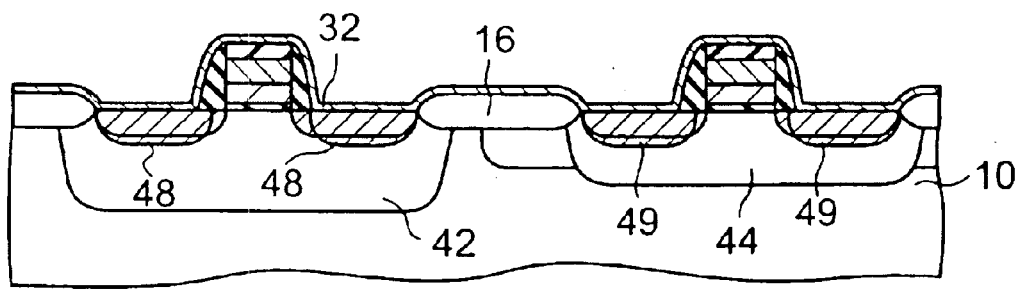
FIGS. 17A to 17C are diagrams showing the manufacturing method of the CMOS image sensor of the embodiment, and section views (No. 6) of a peripheral CMOS circuit formation portion.

Next, as shown in FIG. 9C and FIG. 17A, Ti is sputtered on the entire surface of the resultant structure, thus forming a Ti film 32 having a thickness of 30 nm. Then, a thermal treatment is performed at a temperature of 700° C. and for 90 seconds, and a portion of the Ti film 32 contacting the semiconductor substrate 10 is converted to silicide.

Figure 10A:
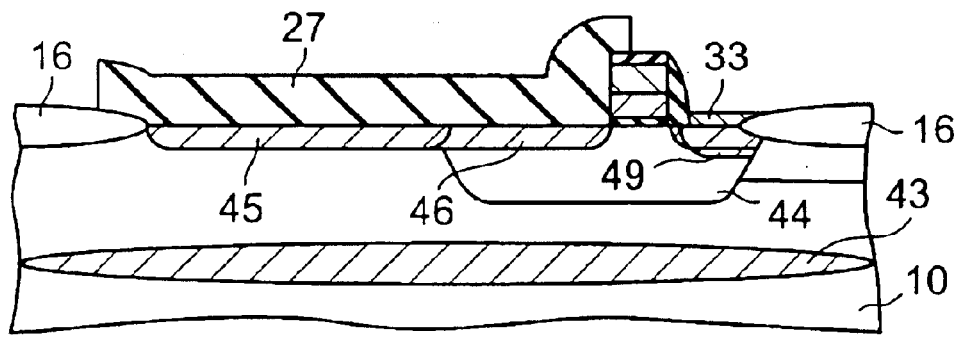
FIGS. 10A to 10C are diagrams showing the manufacturing method of the CMOS image sensor of the embodiment, and section views (No. 7) of formation portions of the photodiode and the reset transistor.
Figure 17B:
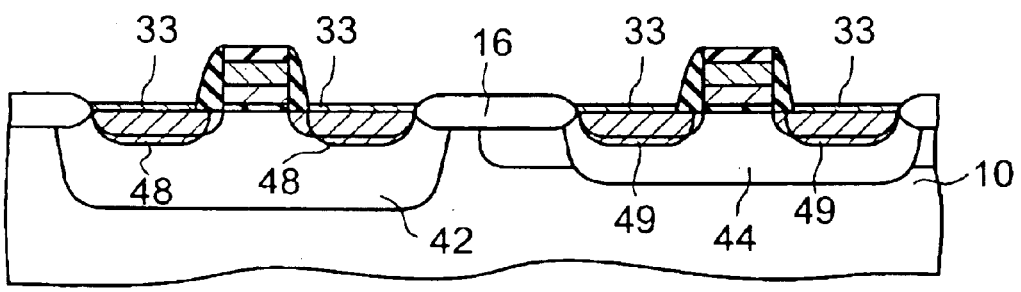

Thereafter, as shown in FIG. 10A and FIG. 17B, an unreacted portion of the Ti film 32 is removed by etching. By this etching, a silicide film 33 is left on surfaces of source/drain regions of the MOS transistor. After that, a thermal treatment is performed at a temperature of 800° C. and for 30 seconds, thus stabilizing the silicide film 33.

Figure 10B:
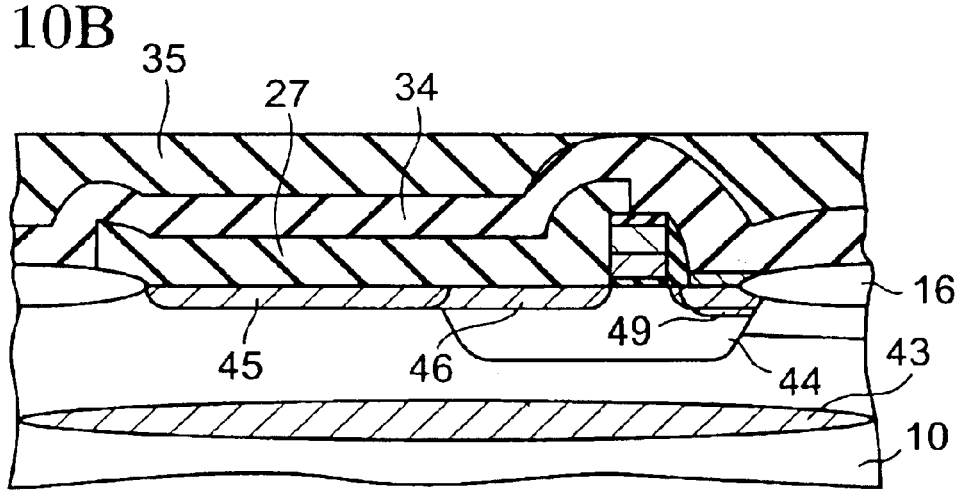
Figure 17C:
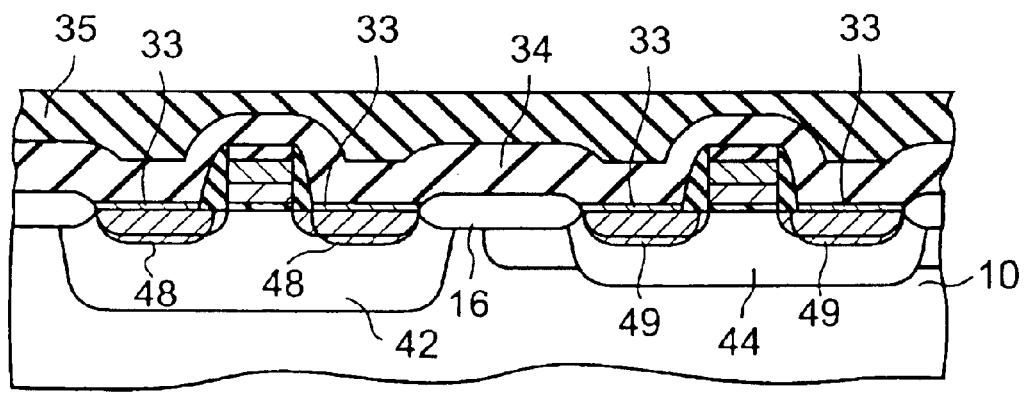

Next, as shown in FIG. 10B and FIG. 17C, an insulating film 34 is formed on the entire surface of the resultant structure. This insulating film 34 is formed by laminating, for example, SiON having a thickness of 200 nm and, for example, $SiO_2$ having a thickness of 300 nm. Thereafter, the insulating film 34 is coated with an SOG (Spin On Glass) film 35, thus flattening the surface of the resultant structure.

Figure 10C:
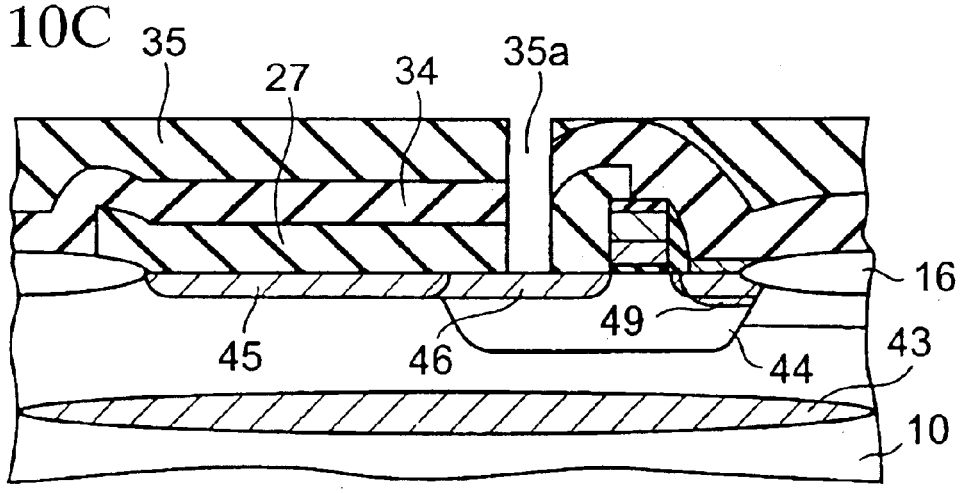
Figure 18A:
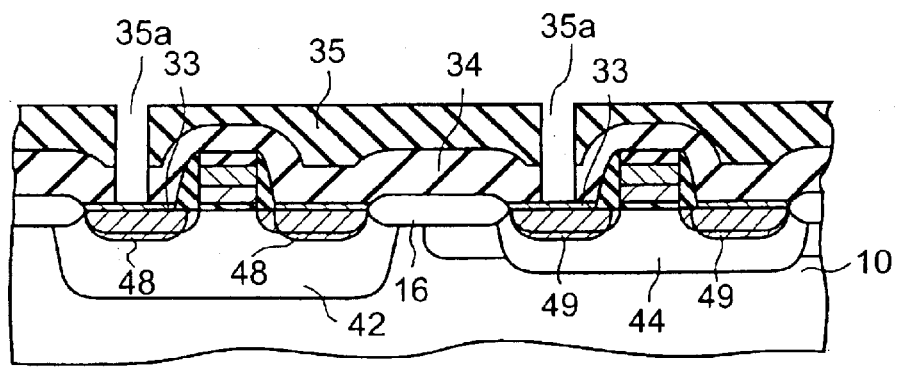
FIGS. 18A to 18C are diagrams showing the manufacturing method of the CMOS image sensor of the embodiment, and section views (No. 7) of a peripheral CMOS circuit formation portion.

Subsequently, a photoresist film (not shown) is formed on the SOG film 35, and an opening portion is provided in a contact hole formation portion after exposure and developing steps. Then, the SOG film 35 and the insulating film 34 are etched through this opening portion, and a contact hole 35a reaching the impurity region 46 that is the drain of the reset transistor and the predetermined silicide film 33 is formed as shown in FIG. 10C and FIG. 18A. Thereafter, the resist film is removed.

Figure 11A:
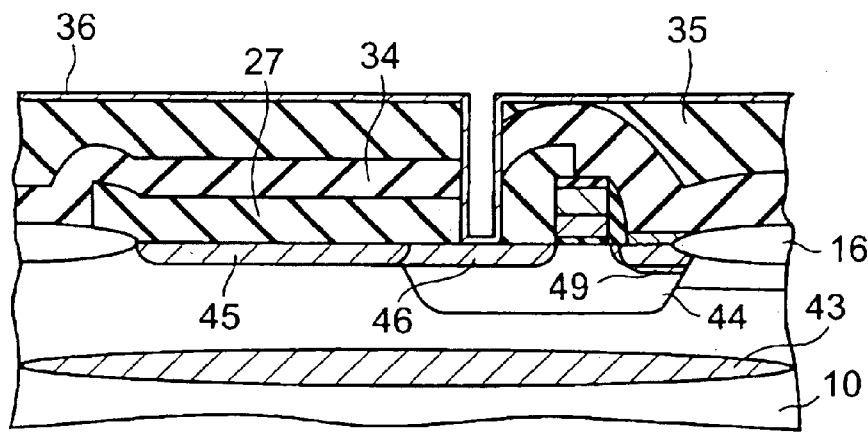
FIGS. 11A to 11C are diagrams showing the manufacturing method of the CMOS image sensor of the embodiment, and section views (No. 8) of formation portions of the photodiode and the reset transistor.
Figure 11B:
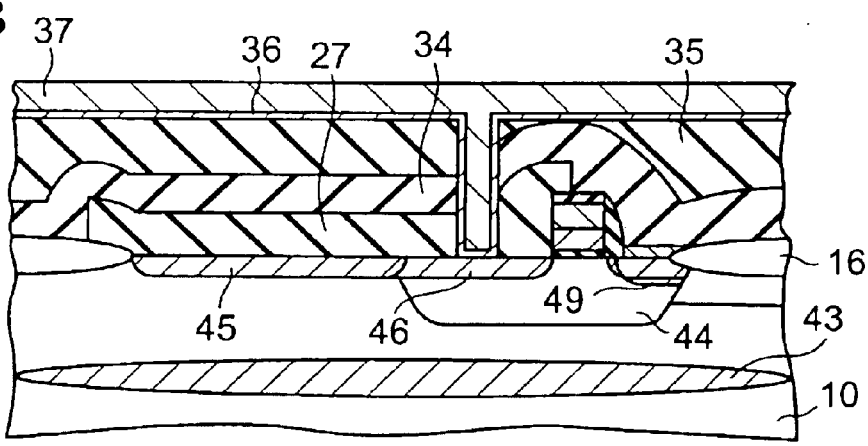
Figure 18B:
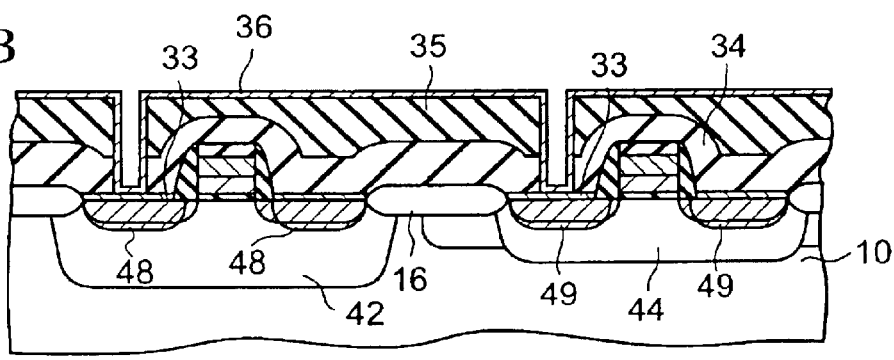
Figure 18C:
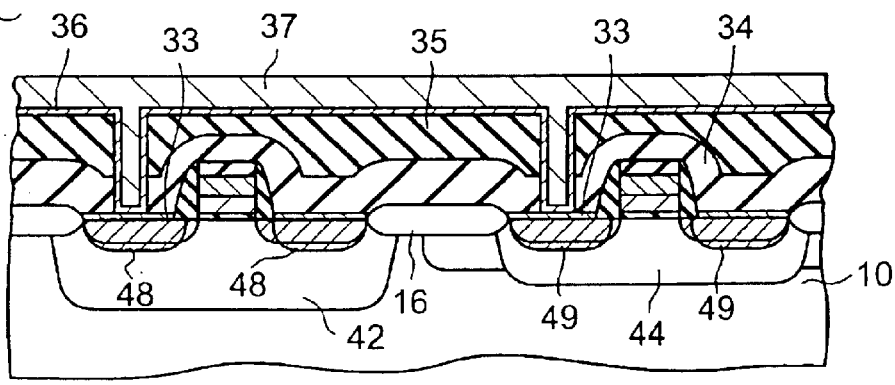

Next, as shown in FIG. 11A and FIG. 18B, Ti and TiN are formed to thicknesses of 20 nm and 50 nm on the entire surface of the resultant structure by sputtering, respectively, thus forming a Ti film 36. Thereafter, as shown in FIG. 11B and FIG. 18C, a tungsten (W) film 37 is formed to a thickness of 800 nm on the T1 film 36, thus burying the contact hole 35a with the tungsten.

Figure 19A:
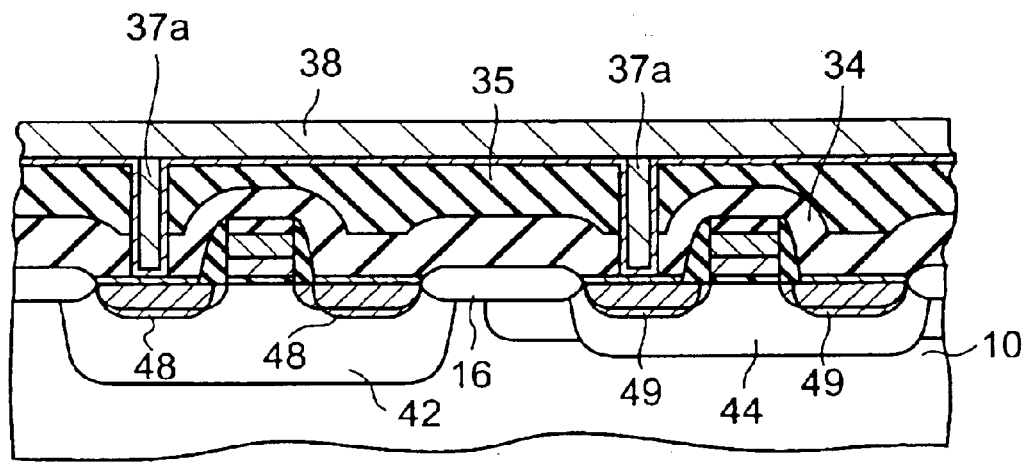

Thereafter, as shown in FIG. 19A, a portion of the tungsten film 37 other than the contact hole 35a is removed by performing CMP (Chemical Mechanical Polishing) for the tungsten film 37. Thus, a tungsten plug 37a is formed. Then, Ti and TiN are formed to thicknesses of 20 nm and 50 nm, respectively, and AlCu, Ti and TiN are respectively formed to thicknesses of 500 nm, 5 nm and 100 nm thereon. Thus, a conductive film 38 is formed.

Figure 11C:
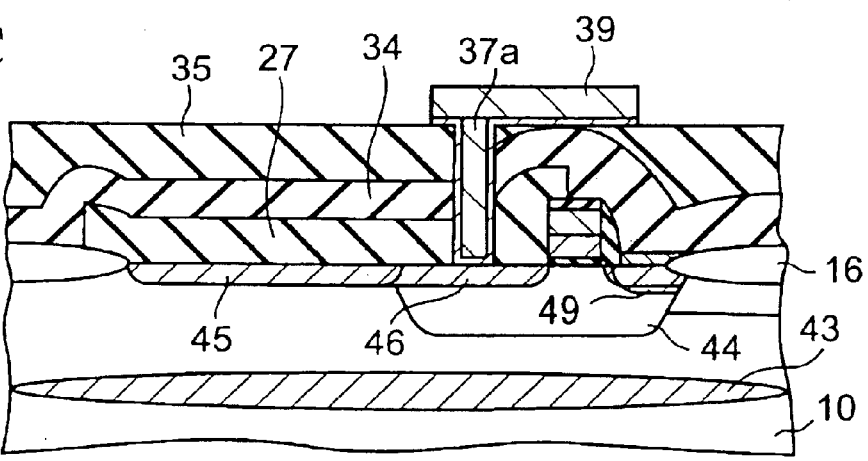
Figure 19B:
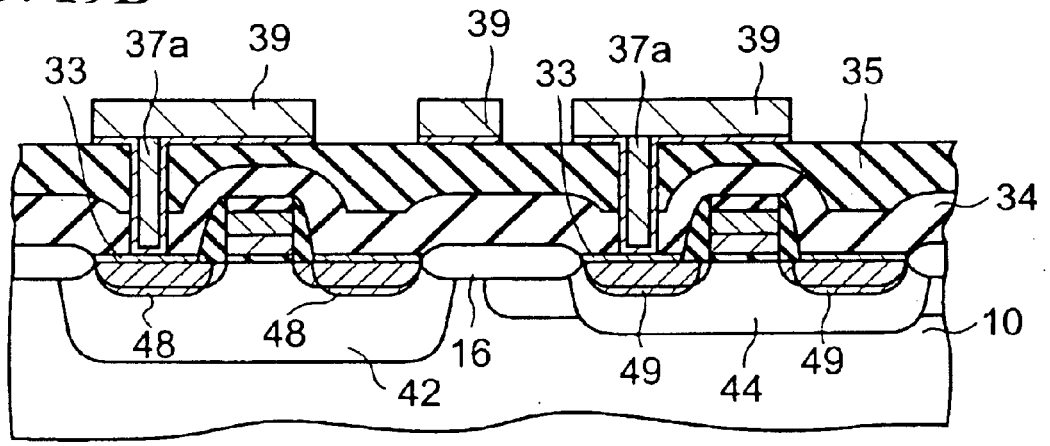

Next, as shown in FIG. 11C and FIG. 19B, the conductive film 38 is patterned, thus forming a predetermined wiring 39. In such manner as described above, the CMOS image sensor of this embodiment is completed.

In the CMOS image sensor formed in the above-described manner, since electrical connections of the source/drain of the transistors with the wiring are made at the positions other than the drain of the reset transistor T1 through the silicide film 33, a contact resistance at the connection portion is low. Furthermore, since a silicide film is not provided in the drain portion of the reset transistor T1 directly connected to the photodiode PD, an increase in leak current owing to metal atoms is prevented, and a S/N ratio is increased.

Figure 21:
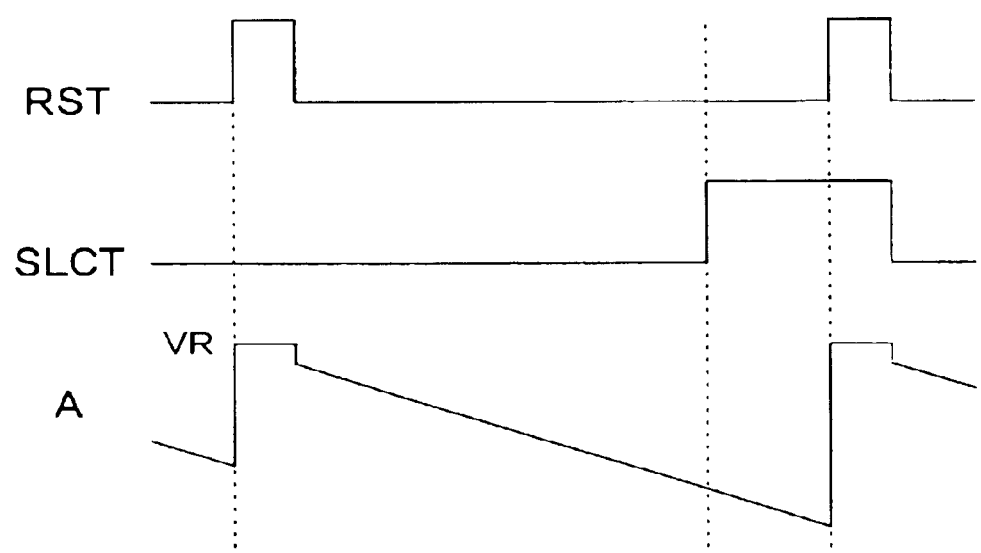
FIG. 21 is a timing chart showing an operation of the CMOS image sensor of the embodiment.

FIG. 21 is a timing chart showing an operation of the CMOS image sensor of this embodiment. A reset signal RST is a signal that becomes high level in a constant cycle. When the reset signal RST becomes high level, a potential on the cathode side of the photodiode PD, which is a potential at the portion corresponding to the portion shown by the point A in FIG. 1, becomes equal to a constant voltage (VR). Thereafter, when light reaches the photodiode PD after the reset signal RST becomes low level, charges in accordance with an intensity of the light are generated in the photodiode PD. The charges generated change the potential at the point A, that is, the gate voltage of the transistor T2. When a select signal SLCT becomes high level, an electric signal in accordance with the potential at the point A at that time is transmitted to a reading-out circuit (peripheral circuit) through the transistor T3. In such manner, the signal in accordance with the intensity of the light that reached the photodiode PD is transmitted to the peripheral circuit.

Figure 20:
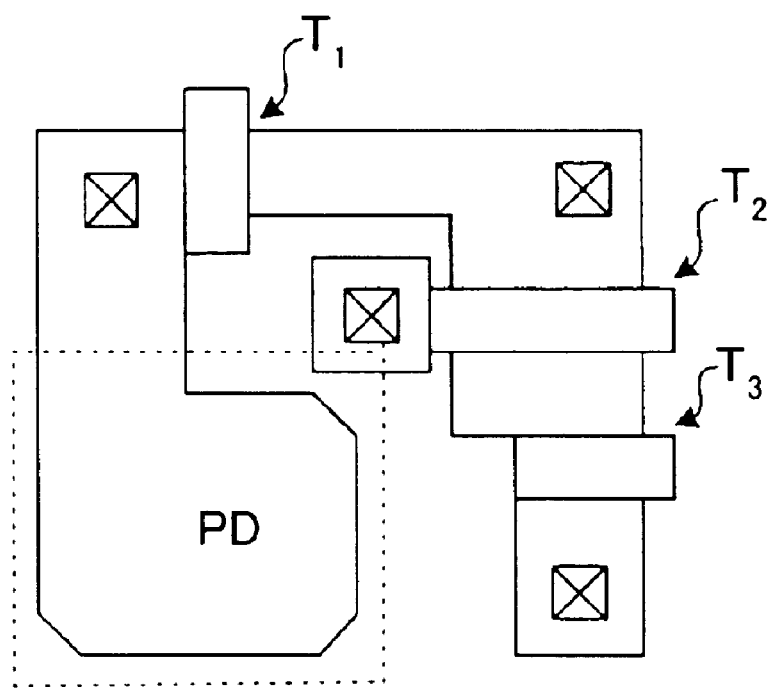
FIG. 20 is a plan view showing a CMOS image sensor of a comparison example.

Results obtained by examining influences of the leak current after manufacturing actually the CMOS image sensor according to the above-described method will be described below. The CMOS image sensor was manufactured by the above-described method as an example. Also a CMOS image sensor as a comparison example was manufactured in the same manner as that of the embodiment other than formation of the silicide film on a surface of the drain of the reset transistor T1. In the CMOS image sensor of the comparison example, only a photodiode formation portion (portion shown by the dotted lines in FIG. 20) is covered with a silicon oxide film in a silicide film formation step, as shown in FIG. 20.

Although a peripheral leak current component and an area leak current component cannot be measured directly, the leak current can be estimated depending on an output from an A/D converter. Specifically, the CMOS image sensor is driven in a dark portion, and a threshold is set to an output code of the A/D converter. Levels of the leak currents can be compared by generation frequencies of signals larger than the threshold. To be concrete, the generation frequencies of signals showing an output code of the A/D converter, which is equal to 500 (equivalent to 500 mV) or more, were examined. As a result, while the generation frequency was several tens (a sampling time of the A/D converter was 26 msec) in the CMOS image sensor of the comparison example, the generation frequency in the CMOS image sensor of this embodiment was zero to several. From this fact, it was confirmed that the CMOS image sensor of this embodiment shows less leak current compared to the CMOS image sensor of the comparison example. Furthermore, a silicide film is not formed in the drain portion of the reset transistor T1 in the CMOS image sensor of this embodiment, and a contact resistance is considered to be somewhat high. However, the CMOS image sensor operates normally, and it was confirmed that the CMOS image sensor has no trouble practically. In the CMOS image sensor of this embodiment, since the silicide film is provided in the source/drain other than the drain portion of the reset transistor T1, the CMOS image sensor of this embodiment has the same transistor parameters as those of the CMOS image sensor of the comparison example, and there is no problem in designing and using the CMOS image sensor.

Note that the CMOS image sensor of the present invention is not limited to the one in which the gate voltage of the reset transistor is changed in the two stages of low and high level, and can be applied also to the one which is driven by changing the gate voltage in three or more stages.

As described above, since the silicide film is not formed on the impurity region (the source or drain) connected to the photodiode in the side of the photodiode of the MOS transistor (the reset transistor) in the CMOS image sensor of the present invention, an increase in the leak current owing to the metal atoms is prevented, and noises are reduced. Moreover, since the silicide film is formed on the impurity regions of the MOS transistors other than the reset transistor and the wiring and each of the impurity regions are electrically connected to each other through the silicide film, the contact resistance between the wiring and the impurity region is low, and lowering of electric characteristics can be avoided.

What is claimed is:

1. A CMOS image sensor comprising a pixel consisting of:

a photodiode having an impurity region formed in semiconductor substrate;

a first MOS transistor formed on said semiconductor substrate, the first MOS transistor having an impurity region as a drain connected to said impurity region of said photodiode;

a second MOS transistor formed on said semiconductor substrate, the second MOS transistor having an impurity region as a source connected to a source of said first MOS transistor; and a third MOS transistor formed on said semiconductor substrate, the third MOS transistor having an impurity region as a source connected to a drain of said second MOS transistor, wherein an insulating film formed on the first, second and third MOS transistors, the insulating film having contact holes reaching the sources and drains of the first, second and third MOS transistors, a suicide film is not formed on a surface of the drain of the first MOS transistor, but the suicide film is formed on each surface of the sources and drains of the first, second and third MOS transistors except for the drain of the first MOS transistor.

2. The CMOS image sensor according to claim 1, wherein a MOS transistor circuit for processing a signal output from said third MOS transistor is formed on said semiconductor substrate.

3. The CMOS image sensor according to claim 1, wherein a timing circuit for supplying a signal to each gate of said first and third MOS transistors at a predetermined timing is provided on said semiconductor substrate, and a reading-out circuit for reading out a signal output from said third MOS transistor is provided on said semiconductor substrate.

4. The CMOS image sensor according to claim 1, the CMOS image sensor further comprising:
   an interlayer insulating film for covering said first to third MOS transistors;
   a wiring formed on said interlayer insulating film; and
   a connection plug buried in said interlayer insulating film, and the connection plug connecting said wiring to at least one of the sources and the drains of said first, second and third MOS transistors electrically.

5. The CMOS image sensor according to claim 1, wherein the source of said first MOS transistor, the source/drain of said second MOS transistor, and the source/drain of said third MOS transistor have an LDD structure, and the drain of said first MOS transistor has no LDD structure.

6. A CMOS image sensor comprising:
   a photodiode having an impurity region formed by introducing impurities into the semiconductor substrate;
   first and second MOS transistors having source regions and drain regions formed respectively by introducing impurities into the semiconductor substrate; and
   an insulating film formed on the first and second MOS transistors, the insulating film having contact holes reaching the source regions and drain regions of the first and second MOS transistors.

wherein a silicon oxide film is formed on a surface of the impurity region of the photodiode and the drain region of the first MOS transistor which connects to the impurity region of the photodiode, but a suicide film is formed on a surface of the source region of the first MOS transistor which is also the drain region of the second MOS transistor and on a surface of the drain region of the second MOS transistor.

7. A CMOS image sensor comprising:
   a photodiode having an impurity region formed by introducing impurities into the semiconductor substrate;
   first and second MOS transistors having source regions and drain regions formed respectively by introducing impurities into the semiconductor substrate; and
   an insulating film formed on the first and second MOS transistors, the insulating film having contact holes reaching the source regions and drain regions of the first and second MOS transistors,
   wherein a silicon oxide film is formed on a surface of the impurity region of the photodiode and the drain region of the first MOS transistor which connects to the impurity region of the photodiode, but a silicide film is formed one surface of the source region of the first MOS transistor which is also the drain region of the second MOS transistor and on a surface of the drain region of the second MOS transistor, and
   a concentration of the impurity region of the photodiode differs from that of the drain region of the first MOS transistor.

* * * * *